United States Patent [19]

Rosbeck et al.

[11] Patent Number: 4,961,098
[45] Date of Patent: Oct. 2, 1990

[54] HETEROJUNCTION PHOTODIODE ARRAY

[75] Inventors: Joseph P. Rosbeck, Santa Barbara; Charles A. Cockrum, Goleta, both of Calif.

[73] Assignee: Santa Barbara Research Center, Goleta, Calif.

[21] Appl. No.: 375,229

[22] Filed: Jul. 3, 1989

[51] Int. Cl.$^5$ .......................................... H01L 27/14
[52] U.S. Cl. ...................................... 357/30; 357/32; 357/90; 357/55; 357/56; 357/16; 357/47
[58] Field of Search ................. 357/30 B H, 30 P, 32, 357/90, 55, 56, 16, 47

[56] References Cited

U.S. PATENT DOCUMENTS

| | | | |
|---|---|---|---|
| 3,677,280 | 7/1972 | Weckler | 317/235 R |
| 3,845,494 | 10/1974 | Ameurlaine et al. | 357/30 |
| 3,858,306 | 1/1975 | Kloek et al. | 29/572 |
| 3,988,774 | 10/1976 | Cohen-Solal et al. | 357/30 |
| 4,105,478 | 8/1978 | Johnson | 148/188 |
| 4,132,999 | 1/1979 | Maille et al. | 357/30 |
| 4,206,003 | 6/1980 | Koehler | 357/30 X |
| 4,411,732 | 10/1983 | Wotherspoon | 158/643 |
| 4,532,699 | 8/1985 | Bourdillot et al. | 357/56 X |
| 4,639,756 | 1/1987 | Rosbeck et al. | 357/30 |
| 4,646,120 | 2/1987 | Hacskaylo | 357/32 X |
| 4,766,084 | 8/1988 | Bory et al. | 437/3 |

FOREIGN PATENT DOCUMENTS

| | | | |
|---|---|---|---|
| 60-157273 | 8/1985 | Japan . | |
| 2100927 | 1/1983 | United Kingdom | 357/30 X |

OTHER PUBLICATIONS

Lanir et al., "Backside-Illuminated HgCdTe/CdTe Photodiodes," Appl. Phys. Lett. 34(1), Jan. 1, 1979, pp. 50-52.

Almasi et al., "CdTe—HgTe Heterostructures", Journal of Applied Physics, vol. 39, No. 1, Jan. 1968, pp. 233-245.

Stelzer et al., "Mercury Cadmium Telluride as an Infrared Detector Material," IEEE Transactions on Electron Devices, vol. ED-16, No. 10, Oct. 1969, pp. 880-884.

Primary Examiner—William Mintel
Attorney, Agent, or Firm—W. C. Schubert; W. K. Denson-Low

[57] ABSTRACT

An array of photovoltaic radiation detectors and a method of fabricating same. The array 10 includes a substrate 12 substantially transparent to radiation having wavelengths of interest and a radiation absorbing base layer 14 having a first surface 14a overlying a surface of the substrate for admitting incident radiation into the base layer. The base layer is comprised of a compositionally graded p-type $Hg_{1-x}Cd_xTe$ material wherein x equals approximately 0.6 to approximately 0.8 at the first surface and equals less than approximately 0.4 at a second surface 14b. A cap layer 16 overlies the second surface of the radiation absorbing base layer, the cap layer also being compositionally graded. The cap layer has a bandgap that increases in width as a function of distance from the second surface of the base layer. The array further includes a plurality of regions 18 formed through the top surface of and substantially wholly within the wide bandgap cap layer, each of the regions forming a p-n junction 18a with the underlying material of the cap layer for collecting charge carriers. A plurality of channels 22 prevent lateral diffusion of charge carriers through the base layer.

20 Claims, 1 Drawing Sheet

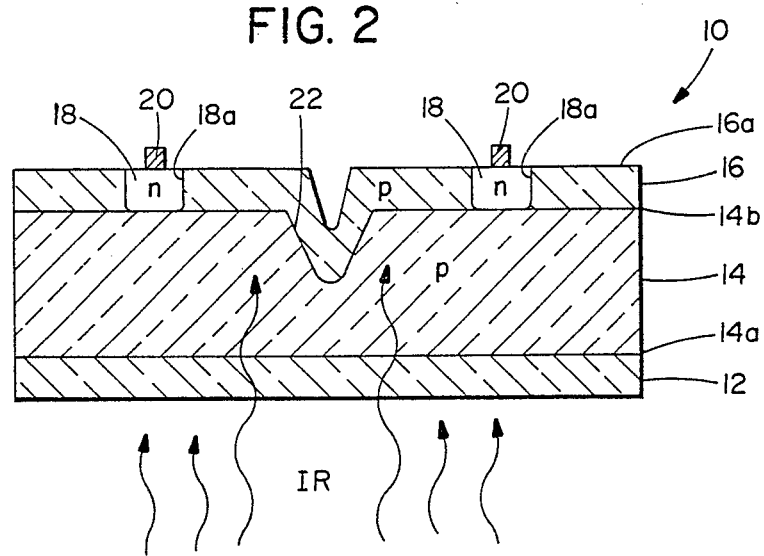
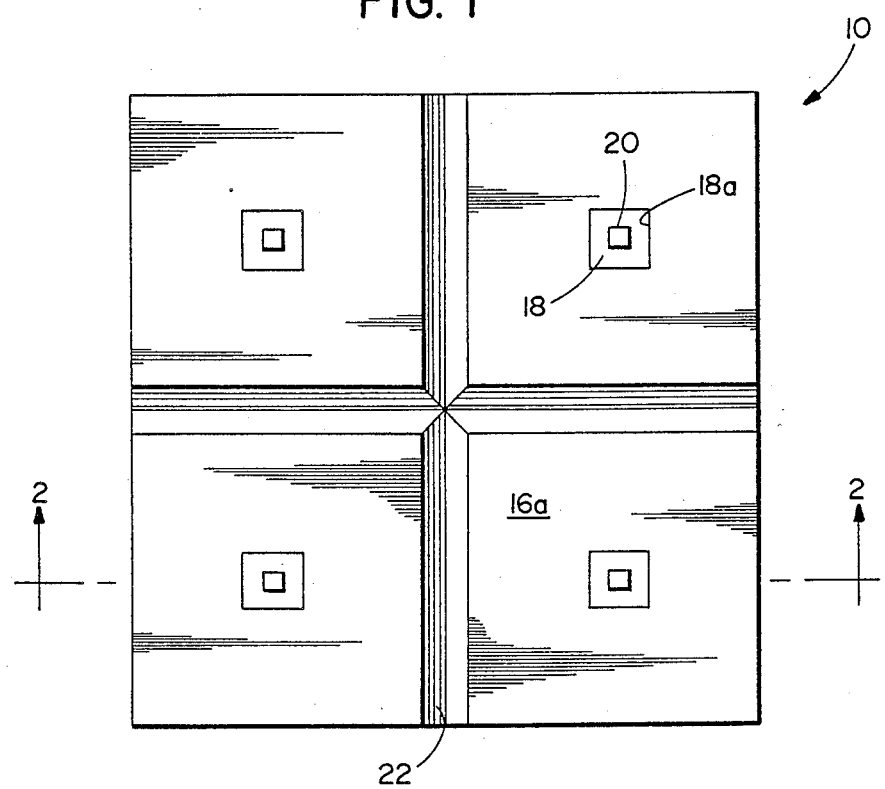

4,961,098

HETEROJUNCTION PHOTODIODE ARRAY

CROSS-REFERENCE TO RELATED PATENT APPLICATION:

This application is related to a commonly assigned U.S. Pat. Application Ser. No. 07/490,04 filed Mar. 7, 1990, entitled "Control of Optical Crosstalk Between Adjacent Photodetecting Regions", P. Norton et al., (Attorney's Docket No. PD-S88018).

FIELD OF THE INVENTION

This invention relates generally to radiation detectors and, in particular, relates to an IR radiation detecting array comprised of graded composition Group II-VI material that includes an implanted or diffused p-n junction formed wholly within a wide-bandgap, graded composition epitaxial capping layer.

BACKGROUND OF THE INVENTION

Conventional types of photovoltaic (PV) HgCdTe radiation detecting arrays having p-n junctions formed by ion implant techniques are known to experience several problems One problem relates to the absence of heterojunctions and, therefore, a low value of RoA. Other problems relate to poor high temperature bake stability and high junction capacitance. For arrays comprised of non-implanted junctions reproducibility and photodiode uniformity across the array are generally less than optimum. Furthermore, conventional arrays comprised of heterojunction devices do not permit precise control of the electrical junction location relative to the material bandgap, thus making device optimization difficult.

SUMMARY OF THE INVENTION

The foregoing problems are overcome and other advantages are realized by an array of photovoltaic radiation detectors that includes a compositionally graded radiation absorbing base layer having a first surface. The base layer absorbs the radiation and generates charge carriers therefrom. The array further includes a cap layer overlying a second surface of the radiation absorbing base layer, the cap layer being a compositionally graded layer having a bandgap that increases in width as a function of distance from the second surface. In accordance with the invention the array has a plurality of ion implanted or diffused regions formed through a top surface of and substantially wholly within the wider bandgap cap layer. Each of the regions is implanted or diffused with a chemical species selected for forming a p-n junction with the surrounding material of the cap layer and/or the underlying base layer. Each region is separated from adjacent regions by a groove or trench structure that extends partially into the base layer.

In accordance with one method of the invention of fabricating an array of radiation receiving photodiodes there is disclosed the steps of: (a) providing a compositionally graded radiation absorbing base layer comprised of p-type $Hg_{1-x}Cd_xTe$ and (b) forming a compositionally graded cap layer over a top surface of the base layer. The compositionally graded cap layer is formed such that it is comprised of p-type $H_{1-x}Cd_xTe$ adjacent to the top surface of the base layer and of variable composition such that the bandgap of the cap layer increases as a function of distance away from the top surface of the base layer. The method further includes a step of forming by ion implantation or diffusion a plurality of n-type regions through a top surface of the cap layer, the regions being formed such that they are contained substantially wholly within the cap layer for forming a plurality of p-n diode junctions therewith.

BRIEF DESCRIPTION OF THE DRAWING

The above set forth and other features of the invention will be made more apparent in the ensuing Detailed Description of the Invention when read in conjunction with the attached Drawing, wherein:

FIG. 1 is a top view, not to scale, of an array of radiation detectors constructed in accordance with the invention; and FIG. 2 is a cross-sectional view, not to scale, taken along the section line labeled 2-2 of FIG. 1.

DETAILED DESCRIPTION OF THE INVENTION

FIGS. 1 and 2 show illustrative top and cross-sectional views, respectively, of a radiation detecting array 10. FIGS. 1 and 2 are not drawn to scale. The array 10 is comprised of Group II-VI material and a specific embodiment having a radiation absorbing layer comprised of HgCdTe will be described in detail below. It should be realized that the teaching of the invention is applicable to arrays comprised of other materials and to other families of materials such as Group III-V material. Furthermore, although FIGS. 1 and 2 illustrate a backside illuminated two-dimensional array having four PV detectors the teaching of the invention is also applicable to single detectors and to one-dimensional and two-dimensional arrays comprised of more or less than four detectors. The teaching of the invention is also applicable to front-side illuminated arrays.

Referring to FIGS. 1 and 2 it can be seen that the array 10 includes a substrate 12. The substrate 12 is substantially transparent to incident IR radiation and is electrically insulating. By example, the substrate 12 is comprised of CdZnTe having a total thickness of approximately 900 microns. Overlying substrate 12 is a radiation absorbing base layer 14 having a lower surface 14a in contact with the substrate 12 and an upper surface 14b. Base layer 14 is comprised of p-type $Hg_{1-x}Cd_xTe$ wherein x has a value of approximately 0.6 to approximately 0.8 at the surface 14a and is graded in value such that at the surface 14b x has a value of approximately 0.2 for LWIR radiation, approximately 0.3 for MWIR radiation or approximately 0.4 for SWIR radiation. The energy band gap of the base layer 14 nonlinearly decreases in width as the surface 14b is approached such that the desired final energy band gap value is asympototically approached through the upper several microns of base layer 14 material. Base layer 14 has a thickness of approximately 15 microns.

Overlying the radiation absorbing base layer 14 is a graded composition $Hg_{1-x}Cd_xTe$ cap layer 16 that is compositionally graded to wider bandgap material comprised of CdTe, $Hg_{1-x}Cd_xTe$, HgCdZnTe, $Cd_{1-y}Zn_yTe$ or combinations thereof at the upper surface 16a. For example, the cap layer 16 varies in composition from $Hg_{1-x}Cd_xTe$, where x is less than approximately 0.4 at the surface 14b, to CdTe, where x has a value of approximately 1.0 at an upper surface 16a. As such, the energy bandgap of the cap layer 16 increases in width as a function of distance from the surface 14b and as the surface 16a is approached. The wider bandgap cap layer 16, relative to upper portion of the layer 14, functions as a layer of high quality surface passivation. Cap layer 16 has a typical thickness of approximately one to approximately two microns. Lattice matching is not required, but a cap layer comprised of $Cd_{1-y}Zn_yTe$ can be lattice matched to HgCdTe by making y approximately 0.04. A lattice matched cap layer 16 provides advantages derived from reducing disorder at the CdZnTe/HgCdTe interface. The cap layer 16 may be comprised of p-type material as shown in FIG. 2 or may be substantially undoped.

In accordance with the invention it is within the wide bandgap cap layer 16 that p-n photodiode junctions are formed. The exact location of the junction relative to the materials, bandgaps is controlled to optimize both $R_oA$ and quantum efficiency. Thus, further in accordance with the invention the array 10 includes ion implanted or diffused n-type regions 18 within the cap layer 16 for forming photodiode p-n junctions 18a. In electrical contact with the regions 18 is contact metalization 20 for coupling each of the junctions 18a to an external readout circuit (not shown). Boron is one suitable chemical species for implanting within the surface of the cap layer 16, and In is a suitable n-type diffusant.

The implant or diffusion depth is controlled during processing such that the maximum depth of the region 18 is substantially equal to the thickness of the cap layer 16 such that the region 18 is substantially wholly contained within the wide bandgap material of the cap layer 16, and the p-n junction is located essentially at the surface 14b.

In the radiation detector of the invention a channel 22 is etched partially into the compositionally graded p-type base layer 14 in order to substantially prevent crosstalk between the individual photodiodes. The channel 22 operates to physically prevent photocarriers that are generated primarily in the longer wavelength HgCdTe material near a junction 18a from laterally diffusing to adjacent junctions. As can be seen, the channel 22 is etched before the deposition of the cap layer 16 such that the exposed surfaces of the channel 22 are also passivated. The depth of the channel 22 is typically from two to four microns and the width is typically equal to the depth or is somewhat wider.

In operation, and for the back-side illuminated device shown, IR radiation is incident upon and passes through the transparent and electrically insulating substrate 12 and passes into and is absorbed within the electrically conducting p-type base layer 14. The absorbed radiation generates electron-hole pairs and the minority carrier electrons diffuse toward the p-n junctions 18a to create a current in an external circuit (not shown) connected between the n regions 18 and the base layer 14.

The array construction shown in FIGS. 1 and 2 exhibits important advantages over the previously described conventional devices in that the junction 18a is located substantially within the wider bandgap cap layer 16, the same layer which also serves as an integral passivation. The depth of the ion implant or diffusion is controlled to place the electrical junction edge so as to minimize junction dark leakage current without significantly reducing quantum efficiency. This arrangement has several advantages over conventional junctions implanted or diffused into a constant bandgap base layer. Specifically, leakage current is reduced and diode impedance is increased by forming one side of the junction in wider bandgap material. Also, since the bandgap of the cap layer is quite wide at the outer surface of the device (e.g. 1.6eV for CdTe), the cap layer forms a natural passivation which has been shown to reduce diode leakage current and improve stability during elevated temperature storage.

In accordance with the invention the use of ion implantation or diffusion to form the junction 18a improves junction uniformity. It also provides for reduced junction capacitance since the electrical junction is made smaller than the corresponding optical junction.

The interdiffused cap layer 16 may be created by a number of processes. One suitable process involves an annealed interdiffusion of CdTe with the base layer 14. Another suitable process involves an LPE, MBE, or MOCVD grown cap layer. Still another suitable process involves the diffusion of Cd and/or Zn into the base layer 14. The base layer 1 may also be formed by LPE, MBE or MOCVD. It should be noted however that the compositional grading of the base and cap layers is best accomplished by the VPE and MOCVD growth techniques. A wet chemical etch through a suitably patterned mask is preferably employed to create the channels 22. The implanted or diffused junctions are also formed through a suitably windowed mask. Subsequent metalization steps are performed such that the individual diodes can be coupled to suitable readout circuitry.

Arrays of devices constructed in accordance with the invention have revealed the following levels of performance relative to conventional implanted arrays. RoAj at 195K for 4.5 micron cutoff devices is 60 ohms-cm$^2$ with a 5 volt breakdown while conventional devices exhibit 10 ohms-cm$^2$ with a 1 volt breakdown. 1/f noise at 100 mV reverse bias and 1 Hz is $10^{-5}$ V/ Hz as opposed to $10^{-4}$ V/ Hz for conventional devices. RoAj at 120K is approximately $2 \times 10^6$ ohms-cm$^2$ as compared with $2 \times 10^4$ ohms-cm$^2$ for conventional devices. In addition, bake stability is improved over conventional devices.

While the invention has been particularly shown and described with respect to a preferred embodiment thereof, it will be understood by those skilled in the art that changes in form and details may be made therein without departing from the scope and spirit of the invention. For example, the base layer could be n-type material and the regions within the cap layer could be p-type material.

What is claimed is:

1. An array of photovoltaic radiation detectors comprising:

a compositionally graded radiation absorbing base layer having a first surface and a first type of electrical conductivity, the base layer absorbing the radiation and generating charge carriers therefrom, an energy bandgap of the base layer decreasing in width as a function of distance from the first surface;

a cap layer overlying a second surface of the radiation absorbing layer, the cap layer being a compositionally graded layer and having an energy bandgap that increases in width as a function of distance from the second surface; and a plurality of regions of opposite conductivity to the base layer formed through a top surface of and substantially wholly within the cap layer, each of the regions forming a p-n junction with surrounding material for collecting the charge carriers; and wherein the array further includes grooves underlying the cap layer and formed through the second surface of the base layer to a predetermined depth that is less than a thickness of the base layer, individual grooves being disposed between individual adjacent ones of the p-n junctions, the predetermined depth being sufficiently deep to substantially prevent the lateral diffusion of charge carriers from a portion of the base layer adjacent to a p-n junction to another portion of the base layer adjacent to another p-n junction.

2. An array as set forth in claim 1 wherein the base layer is comprised of p-type $Hg_{1-31\ x}Cd_xTe$, wherein the cap layer is compositionally graded from $Hg_{1-x}Cd_xTe$ to a material selected from the group consisting of CdTe, $Hg_{1-x}Cd_xTe$, HgCdZnTe, $Cd_{1-x}Zn_xTe$ and combinations thereof at a top surface thereof and wherein the regions are n-type regions.

3. An array as set forth in claim 2 wherein the base layer is compositionally graded such that x equals approximately 0.6 to approximately 0.8 at the first surface and less than approximately 0.4 at the second surface.

4. An array as set forth in claim 3 wherein the value of x within the cap layer equals less than approximately 0.4 adjacent to the second surface of the base layer.

5. An array as set forth in claim 1 wherein the cap layer overlies and is in contact with exposed surfaces of the grooves.

6. An array as set forth in claim 1 and further comprising a substantially transparent and electrically insulating substrate having a top surface underlying the first surface of the base layer and a bottom surface for admitting incident IR radiation into the array.

7. An array as set forth in claim 6 wherein the substrate is comprised of CdZnTe.

8. An array as set forth in claim 1 wherein the base layer has a thickness of approximately 15 microns, wherein the cap layer has a thickness of approximately one to approximately two microns and wherein the predetermined groove depth is approximately two to approximately four microns.

9. An array of photovoltaic radiation detectors comprising:
   a substrate comprised of material that is substantially transparent to radiation having wavelengths of interest;
   a radiation absorbing base layer having a first surface overlying a surface of the substrate for admitting incident radiation into the base layer, the base layer absorbing the radiation and generating charge carriers therefrom, the base layer being comprised of compositionally graded $Hg_{1-x}Cd_xTe$ wherein x equals approximately 0.6 to approximately 0.8 at the first surface and is equal to or less than approximately 0.4 at a second surface;
   a cap layer overlying the second surface of the radiation absorbing base layer, the cap layer being compositionally graded from $Hg_{1-x}Cd_xTe$, where x equals less than to a material selected from the group consisting of CdTe, $Hg_{1-x}Cd_xTe$, HgCdZnTe, $Cd_{1-x}Zn_xTe$ and combinations thereof at a top surface thereof and having an energy bandgap that increases in width as a function of distance from the second surface of the base layer;
   a plurality of ion implanted n-type regions formed through the top surface of and substantially wholly within the cap layer, each of the regions forming a p-n junction with the surrounding material of the cap layer for collecting the charge carriers; and
   a plurality of grooves formed through the second surface of the base layer to a depth that is predetermined to be less than a thickness of the base layer, individual ones of the grooves being disposed between individual ones of the p-n junctions for electrically isolating the p-n junctions one from another, the cap layer overlying exposed surfaces of the plurality of grooves.

10. An array as set forth in claim 9 wherein the cap layer is comprised of p-type material.

11. An array as set forth in claim 9 wherein the base layer has a thickness of approximately 15 microns, wherein the cap layer has a thickness of approximately one to approximately two microns and wherein the predetermined depth is approximately two to approximately four microns.

12. An array as set forth in claim 11 wherein each of the n-type regions has a depth approximately equal to the thickness of the cap layer.

13. An array of photovoltaic infrared radiation detectors including a first layer comprised of photoresponsive Group II-VI p-type semiconductor material, the first layer having a composition which varies across a thickness of the first layer from a first surface of the first layer to a second surface of the first layer such that a magnitude of an effective energy bandgap of the first layer decreases in width from the first surface to the second surface for constraining photogenerated minority charge carriers to exist within a region of the first layer that is substantially adjacent to the second surface, the array further including a second layer comprised of Group II-VI semiconductor material, the second layer having a first surface that overlies the second surface of the first layer, the second layer having a composition that varies across a thickness of the second layer from the first surface of the second layer to a second surface of the second layer such that a magnitude of an effective energy bandgap of the second layer increases in width from the first surface to the second surface thereof, the array further including a plurality of n-type regions formed substantially only within the thickness of the second layer, each of the n-type regions forming a p-n junction with an underlying portion of the first layer, the array further including a plurality of grooves structures formed through the second surface of the first layer and extending into the first layer to a depth that is less than the thickness of the first layer, individual ones of the groove structures being interposed between at least two adjacent ones of the p-n junctions for substantially preventing the minority charge carriers from laterally diffusing from a region surrounding one p-n junction to a region surrounding an adjacent p-n junction.

14. An array as set forth in claim 13 wherein the first layer is comprised of $Hg_{1-x}Cd_xTe$ and wherein the second layer is compositionally graded from $Hg_{1-x}Cd_xTe$ to a material selected from the group consisting of CdTe, $Hg_{1-x}Cd_xTe$, HgCdZnTe, $Cd_{1-x}Zn_xTe$ and combinations thereof at the second surface of the second layer.

15. An array as set forth in claim 13 and further comprising a substrate underlying the first surface of the first layer, the substrate being comprised of a material that is substantially transparent to infrared radiation for admitting infrared radiation into the first layer.

16. An array as set forth in claim 14 wherein the first layer is compositionally graded such that x equals approximately 0.6 to approximately 0.8 at the first surface and less than approximately 0.4 at the second surface.

17. An array as set forth in claim 16 wherein the value of x within the second layer equals less than approximately 0.4 adjacent to the second surface of the first layer.

18. An array as set forth in claim 13 wherein the second layer is substantially lattice matched to the first layer.

19. An array as set forth in claim 13 wherein the second layer is comprised of p-type Group II-VI material.

20. An array as set forth in claim 1 wherein the cap layer is substantially lattice matched to the base layer.

* * * * *